United States Patent
Weiser et al.

(10) Patent No.: US 10,374,100 B2
(45) Date of Patent: Aug. 6, 2019

(54) PROGRAMMABLE NON-VOLATILE MEMORY WITH LOW OFF CURRENT

(71) Applicant: Texas Instruments Incorporated, Dallas, TX (US)

(72) Inventors: Doug Weiser, Plano, TX (US); Jack G. Qian, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/637,986

(22) Filed: Jun. 29, 2017

(65) Prior Publication Data

US 2019/0006511 A1    Jan. 3, 2019

(51) Int. Cl.
*H01L 29/788*    (2006.01)
*H01L 29/02*    (2006.01)
(Continued)

(52) U.S. Cl.
CPC ...... *H01L 29/788* (2013.01); *H01L 21/26586* (2013.01); *H01L 21/823412* (2013.01); *H01L 27/11517* (2013.01); *H01L 29/66492* (2013.01); *H01L 29/66825* (2013.01); *H01L 29/7838* (2013.01)

(58) Field of Classification Search
CPC ....... H01L 21/26586; H01L 21/823412; H01L 21/047; H01L 27/115; H01L 27/11517; H01L 27/11521; H01L 29/66825; H01L 29/66537; H01L 29/788; H01L 29/7881; H01L 29/7838; H01L 29/66492
USPC ......... 257/315, 316, 345, E21.345, E21.422; 438/257, 302, 593
See application file for complete search history.

(56) References Cited

U.S. PATENT DOCUMENTS 5,068,697 A * 11/1991 Noda ................ H01L 21/28273
257/315
5,920,776 A * 7/1999 Fratin ................ H01L 29/1045
257/E21.422

(Continued)

OTHER PUBLICATIONS

Nishiuchi, et al., "A Normally-Off Type Buried Channel MOSFET for VLSI Circuits," 1978 International Electron Device Meeting, Washington, DC, USA, 1978, pp. 26-29, doi: 10.1109/IEDM.1978.189343.

*Primary Examiner* — Fernando L Toledo
*Assistant Examiner* — Aaron J Gray
(74) *Attorney, Agent, or Firm* — Andrew R. Ralston; Charles A. Brill; Frank D. Cimino

(57) ABSTRACT

In one disclosed embodiment, a non-volatile memory cell is constructed using a floating gate transistor with a channel that includes a buried channel region interposed between two surface channel regions under a floating gate. The surface channel regions are formed using angled lightly-doped drain implantation at locations in the substrate so that a first surface channel region is located under a first end of the floating gate and a second surface channel region is located under a second end of the floating gate. In one embodiment, the floating gate transistor is a PMOS transistor, with the channel being formed in an n-well formed in a p-type substrate, with the buried channel region being formed using a Vtp implant, and with the surface channel regions being formed using angled NLDD implants. The surface channel regions increase the energy barrier along the channel and reduce off state current of the memory cell.

20 Claims, 7 Drawing Sheets

(51) Int. Cl.
*H01L 21/336* (2006.01)
*H01L 29/78* (2006.01)
*H01L 29/66* (2006.01)
*H01L 27/11517* (2017.01)
*H01L 21/8234* (2006.01)
*H01L 21/265* (2006.01)

(56) References Cited

U.S. PATENT DOCUMENTS

| | | | |
|---|---|---|---|
| 6,246,093 B1 * | 6/2001 | Henrickson | H01L 29/1045 257/345 |
| 6,368,915 B1 * | 4/2002 | Montree | H01L 21/28273 257/E21.209 |
| 7,244,651 B2 | 7/2007 | Wu et al. | |
| 2004/0235246 A1 * | 11/2004 | Wu | H01L 21/28273 438/257 |
| 2005/0199936 A1 * | 9/2005 | Wang | G11C 16/0433 257/314 |
| 2009/0238008 A1 * | 9/2009 | Horch | G11C 11/5621 365/185.28 |

* cited by examiner

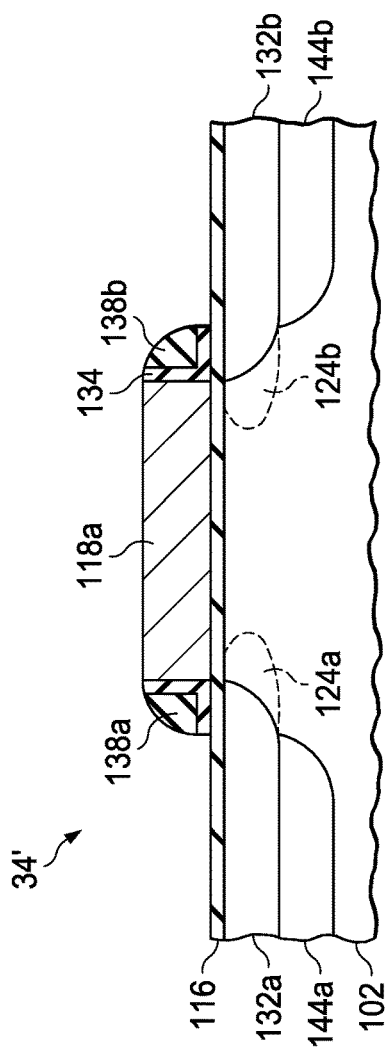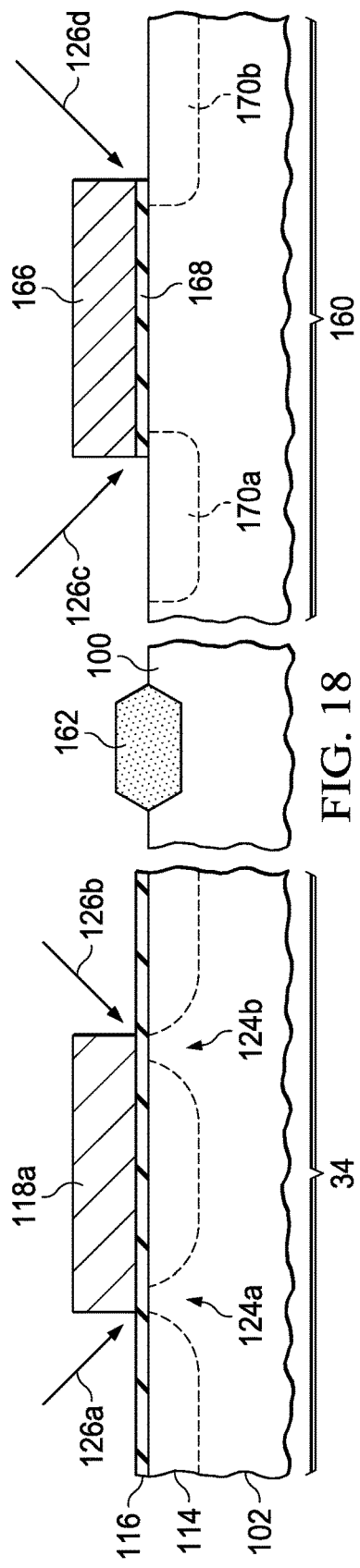

PROGRAMMABLE NON-VOLATILE MEMORY WITH LOW OFF CURRENT

BACKGROUND

This section is intended to introduce the reader to various aspects of art that may be related to various aspects of the subject matter described and/or claimed below. This discussion is believed to be helpful in providing background information to facilitate a better understanding of the various aspects of the present disclosure. Accordingly, it should be understood that these statements are to be read in this light, not as admissions of prior art.

Non-volatile solid-state read/write memory devices are commonplace in many modern electronic systems, particularly in portable electronic devices and systems. Conventional types of non-volatile solid-state memory devices include those referred to as electrically programmable read-only memory (EPROM) devices.

Modern EPROM memory cells include one or more "floating-gate" transistors that store the data state. In general, a floating gate transistor is based on conventional MOSFET transistors in structure, but includes an additional gate element that is electrically isolated, hence the term "floating gate." This floating gate element functions as the storage element for the memory cell. Floating-gate transistors are "programmed" by the application of a bias that enables holes or electrons to tunnel or be injected through a thin dielectric film onto the electrically isolated floating gate. This trapped charge on the floating gate (e.g., a programmed state) will modulate the apparent threshold voltage of the memory cell transistor, as compared with the threshold voltage with no charge trapped on the floating gate (e.g., the un-programmed state). This difference in threshold voltage can be detected by sensing the resulting difference in source-drain conduction, under normal transistor bias conditions, between the programmed and un-programmed states.

Some EPROM devices are "erasable" in that the trapped charge can be removed from the floating gate, for example, by exposure of the memory cells to ultraviolet light (such memories referred to as "UV EPROM") or by application of a particular electrical bias condition that enables tunneling of the charge from the floating gate (such memories referred to as electrically-erasable programmable read-only memory or EEPROM). "Flash" memory devices are typically realized by EEPROM memory arrays in which the erase operation is applied simultaneously to a "block" of memory cells. One class of EPROM memory is referred to as "one-time programmable" (OTP) memory. OTP memory may be constructed similarly or identically to UV EPROM cells, and as such are not electrically erasable. When mounted in an opaque package that prevents the OTP cells from being exposed to ultraviolet light, these memory cells cannot be erased once programmed, hence the term OTP.

The convenience and efficiency of modern EPROM functions has made it commonplace to embed non-volatile memory arrays within larger scale integrated circuits, such as modern complex microprocessors, digital signal processors, and other large-scale logic circuitry. Such embedded non-volatile memories can be used as non-volatile program memory storing software routines executable by the processor, and also as non-volatile data storage. On a smaller scale, non-volatile memory cells can realize control registers by way of which a larger scale logic circuit can be configured, or can be used to trim analog levels after electrical measurement. In embedded applications, OTP memories are useful for storing the program code to be executed by the embedding microcontroller or microprocessor.

As stated above, non-volatile memory, such as EPROM and OTP devices, may be constructed based on floating gate transistors, which typically use a conventional MOSFET transistor structure with the addition of a floating gate element. For example, a floating gate transistor based on a p-type MOSFET (PMOS) is commonly used in constructing such devices. This is at least due in part to PMOS transistors being formed in an n-well structure when the underlying substrate is a p-type substrate, which provides better substrate isolation and less leakage. In some EPROM and OTP devices, the PMOS transistor defining a memory cell can be constructed with a buried channel region, which can favorably result in lower noise and higher drive current. However, buried channel devices often have a lower threshold voltage due to the implantation of the buried channel region. This can result in a fairly high off state current (I-off) compared to the on current (I-on), which can result not only in higher current leakage but also reduce the operating margin and lifetime of the memory cell.

Existing approaches for addressing the high leakage problem sometimes associated with buried channel devices aim to increase the on-to-off current ratio (I-on/I-off). One such approach is to increase the channel length of the device. However, this increases the overall area of the memory cell, which can be undesirable as the demand for memories with higher bit density continues to grow. The on-to-off current ratio can also be increased by either increasing the programmed state current (I-on) of the memory cell or decreasing the off state current (I-off). However, increasing the programmed state current can also result in an increase in programming voltage and programming time, which is also undesirable. Accordingly, semiconductor circuit designers and manufacturers are continually seeking techniques to reduce the off current of such memory cells to improve performance and reliability.

SUMMARY

A summary of certain embodiments disclosed herein is set forth below. It should be understood that these aspects are presented merely to provide the reader with a brief summary of these certain embodiments and that these aspects are not intended to limit the scope of this disclosure.

In accordance with aspects of the present disclosure, a non-volatile memory cell may be constructed using a floating gate transistor that includes a buried channel region interposed between two surface channel regions. The surface channel regions may be formed at locations in the substrate corresponding to approximately where first and second opposite ends of a floating gate overlying the substrate are located. For instance, a first surface channel region may be formed under a first end of the floating gate, and a second surface channel region may be formed under a second end of the floating gate.

The fabrication of a floating gate memory cell transistor in accordance with disclosed embodiments includes forming a doped region or "well" in a substrate layer. For example, in the case of a PMOS floating gate transistor, the substrate may be implanted with an n-type dopant to form an n-well. A buried channel region is then formed in the n-well. Then, a gate dielectric layer is formed over the n-well, and a floating gate structure is formed over the gate dielectric layer. An angled n-type lightly doped drain (NLDD) implantation process is used to form surface channel regions at locations in the n-well generally under each end of the floating gate so that the buried channel region is interposed between the surface channel regions. A source and a drain are then formed on opposite sides of the floating gate.

The addition of the surface channel regions increases the energy barrier along the channel, resulting in an increase in threshold voltage of the transistor. This increases the effective length of the channel and reduces off state current, which improves leakage.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination.

BRIEF DESCRIPTION OF THE DRAWINGS

Various aspects of this disclosure may be better understood upon reading the following detailed description and upon reference to the drawings in which:

FIG. 17 is a cross-sectional view of another embodiment of an OTP memory device that may be included in the OTP memory cell of FIG. 2.

FIG. 18 is a cross-sectional view showing the fabrication of an OTP memory device in accordance with disclosed embodiments alongside another transistor on the same substrate.

DETAILED DESCRIPTION

One or more specific embodiments of the present disclosure are described below. These embodiments are only examples of the presently disclosed techniques. In an effort to provide a concise description of these embodiments, all features of an actual implementation may not be described in the specification. It should be appreciated that in the development of any such implementation, as in any engineering or design project, numerous implementation-specific decisions are made to achieve the developers' specific goals, such as compliance with system-related and/or business-related constraints, which may vary from one implementation to another. Moreover, it should be appreciated that such development efforts might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. The embodiments discussed below are intended to be examples that are illustrative in nature and should not be construed to mean that the specific embodiments described herein are necessarily preferential in nature. Additionally, it should be understood that references to "one embodiment" or "an embodiment" within the present disclosure are not to be interpreted as excluding the existence of additional embodiments that also incorporate the recited features.

Figure 1:
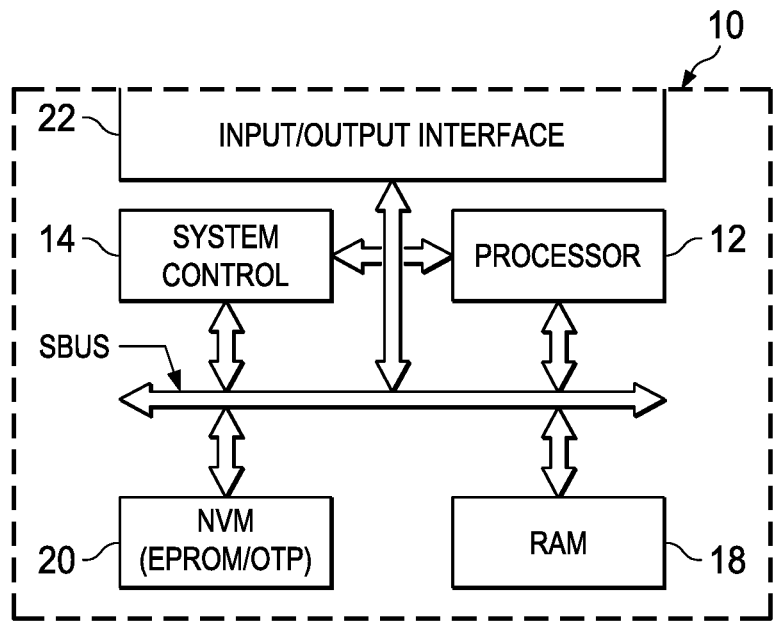
FIG. 1 is a schematic diagram of an electronic device that includes a non-volatile memory having memory cells fabricated in accordance with aspects of the present disclosure.

FIG. 1 is a functional block diagram of an electronic device 10, in accordance with an embodiment. The electronic device 10 includes a processor 12, which is connected to a system bus SBUS. Various memory resources, including random access memory (RAM) 18 and non-volatile memory (NVM) 20, reside on the system bus SBUS and are thus accessible to the processor 12.

The non-volatile memory 20 is used generally for persistent storage of data, whereas RAM 18 typically loses its data state once power is removed. The non-volatile memory may include electrically programmable read-only-memory (EPROM) that can be erased, such as by exposure to ultraviolet light or electrically by application of a particular electrical bias (EEPROM), one-time-programmable (OTP) memory that cannot be erased once written, or a combination of such memories. The non-volatile memory 20 may serve as program memory storing program instructions executable by the processor 12, while RAM 18 serves as data memory. In some cases, program instructions may reside in RAM 18 for recall and execution by processor 12. Other system functions are shown, in a generic sense, in the electronic device 10 by way of system control logic 14 and input/output interface 22.

The processor 12 controls the general operation of the electronic device 10. For instance, processor 12 may provide the processing capability to execute an operating system, programs, user and application interfaces, and any other functions of the device 10. The processor 12 may include a general-purpose or application-specific (ASIC) processor, field-programmable gate array (FPGA), graphics processor (GPU), digital signal processor, a system-on-chip (SoC), microcontroller, and/or related chip sets.

The illustrative electronic device 10 of FIG. 1 may be any type of device that incorporates memory and/or non-volatile memory. For example, the device 10 may be a microcontroller unit or embedded processing unit. In one such embodiment, the device 10 may be a microcontroller unit (MCU) capable of operating over a wide temperature range with generally low power consumption, and which includes a low power processor, a volatile memory, such as SRAM, non-volatile memory, as well as analog and mixed signal and power management circuitries. Such a device may be suitable for a number of applications in various industries, for example, industrial and automotive applications. In other embodiments, the electronic device 10 may be a computing device, such as a mobile telephone (including smartphones), digital media player, a desktop, tablet, or notebook computer, a wearable computing device, and so forth. In such embodiments, the device 10 may include additional functional blocks not shown in FIG. 1, such as input structures, RF circuitry to communicate with a network and/or with other electronic devices, a power source, and/or a display. The various functions of the device 10 may be realized and implemented using hardware elements (e.g., circuitry), software elements (e.g., computer instructions stored on a tangible computer-readable medium) or a combination of both hardware and software elements.

Figure 2:
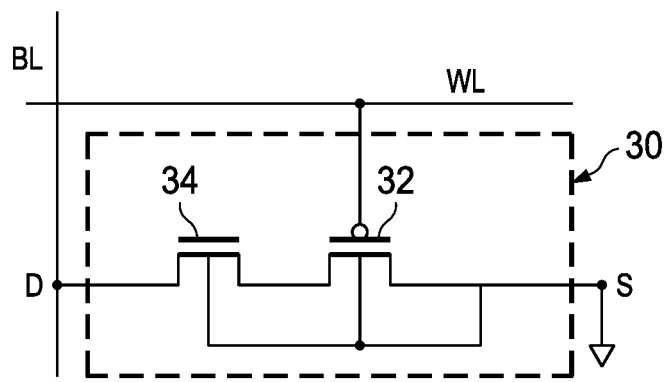
FIG. 2 is a schematic representation of a non-volatile one-time programmable (OTP) memory cell that is part of the non-volatile memory of the device of FIG. 1.

FIG. 2 illustrates an example embodiment of a non-volatile memory cell 30 that may be part a memory array of the non-volatile memory 20. The memory cell 30 structure is an OTP cell that includes transistors 32 and 34 connected in series between a bit line (BL) and a reference voltage (e.g., ground). In the illustrated embodiment, transistors 32 and 34 are both PMOS transistors. The transistor 32 operates as an access transistor with its gate terminal connected to a word line (WL). The transistor 34 operates as an OTP memory. The gate of transistor 34 is left unconnected, and thus operates as a floating gate to provide for non-volatile data storage. While access transistor 32 is depicted as a PMOS transistor in FIG. 2, an NMOS access transistor could also be used in other embodiments depending on whether the word line is driven with a logic low or logic high signal to select the OTP memory cell 30.

The OTP memory 34 may be programmed (sometimes referred to as "burning") to store a particular logic state, for example, a binary 1 or binary 0. When a programming voltage of sufficiently high magnitude is driven across the source and drain of the OTP memory 34, the OTP memory 34 may store a binary value of "1" in a non-volatile manner. The programming voltage may cause the OTP memory 34 to store a binary "1" by causing charge from within a channel of the OTP memory 34 to transfer to the floating gate. Prior to programming, the OTP memory 34 stores a binary "0" in a non-volatile manner. The logic state stored by the OTP memory 34 may be read by accessing the OTP memory cell 30 through activation of the select transistor 32 by asserting an appropriate signal on the WL (e.g., a logic low signal in the case of a PMOS select transistor as shown in FIG. 2). As the transistor 34 is configured as an OTP memory in this example embodiment, once programmed, the stored value cannot be erased.

Figure 3:
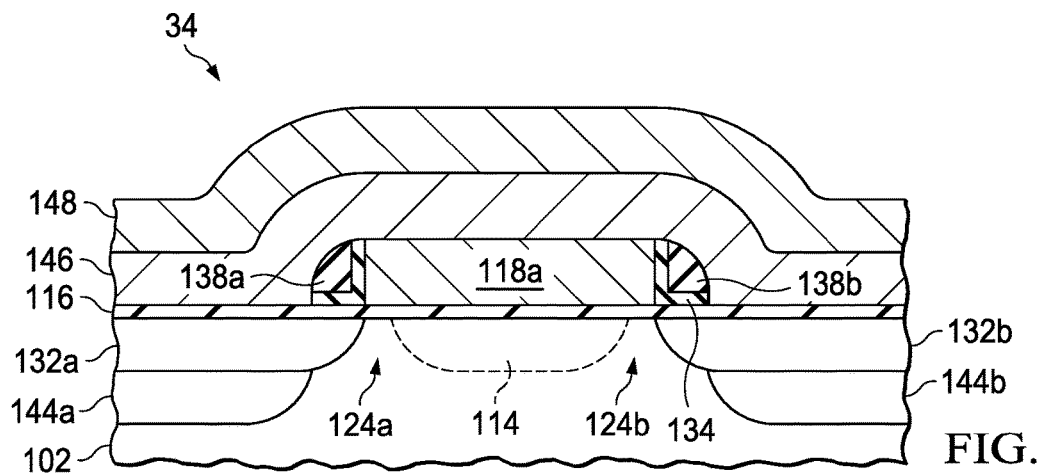
FIG. 3 is a cross-sectional view of an embodiment of an OTP memory device that may be included in the memory cell of FIG. 2, with the fabrication thereof being further depicted in FIGS. 4 to 15 in accordance with one embodiment.

In one embodiment, the OTP memory 34 of FIG. 2 is constructed as a PMOS OTP memory that includes a buried channel region along with a surface channel region formed at each end of the buried channel region. A cross-sectional view of a buried channel PMOS OTP memory 34 is shown in FIG. 3. The buried channel PMOS OTP memory 34 is formed in an n-type material 102, such as an n-well region formed in a p-type substrate. The surface channel regions 124a and 124b may be arranged such that they are located under but at approximately the same lateral positions as the ends of a floating gate structure 118a. The surface channel regions 124a and 124b may be formed by an n-type implant, such as an n-type lightly doped drain (NLDD) implant process, following the formation of the buried channel region 114. The floating gate 118a is formed over a gate dielectric layer 116. Sidewall spacers 138a and 138b are formed adjacent opposite sides of the floating gate 118a. P-type lightly doped drain (PLDD) regions 132a and 132b and the P-type source/drain (PSD) regions 144a and 144b collectively form the source and the drain of the depicted buried channel PMOS OTP memory 34. A passivation layer 146 and a metal layer 148 are formed over the floating gate 118a.

As used herein, the term "channel region" refers to a region between the source and drain of the OTP memory 34 in which a channel can be formed to provide a conductive path between the source and drain, such as during programming or when the OTP memory 34 stores a binary "1". Stated another way, a "channel region" is not meant to convey that a channel is persistently present, but that one can be formed under appropriate operating conditions of the OTP memory 34.

The addition of the surface channel regions 124a and 124b increases the energy barrier along the channel region, which increases the threshold voltage ($V_{th}$). This can result in an increase of the "effective channel length." That is, the addition of the surface channel regions 124a and 124b may allow for the device to exhibit certain properties of a comparable device that lacks the surface channel regions but has a longer channel, such as reduced leakage, without physically increasing the channel length. In some instances, it has been observed that devices constructed to include such surface channel regions in accordance with techniques described herein may exhibit a reduction in off state current leakage (I-off) by up to six orders of magnitude, for example, a reduction from micro-amps (µA) to pico-amps (pA)).

FIG. 4 to FIG. 15 illustrate the fabrication of the OTP memory 34 of FIG. 3 in accordance with an embodiment of the present disclosure. It will be appreciated that the various semiconductor structures illustrated in the following figures are presented in a manner to enable a reader to better understand the fabrication process, and that the elements shown in the following figures are not necessarily drawn to scale.

Figure 4:
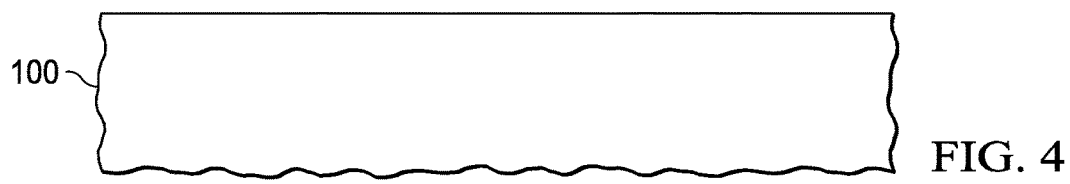
FIG. 4 is a cross-sectional view of a substrate.

The fabrication of a buried channel PMOS OTP memory 34 with surface channel regions begins with formation of a substrate. For instance, FIG. 4 illustrates a p-type substrate layer 100 that may be formed from a semiconductor material, for instance, silicon. However, the substrate layer 100 may be formed from any suitable material as known to those skilled in the art, such as gallium arsenide, gallium nitride, germanium, silicon-germanium, silicon carbide, indium phosphide, epitaxial formations, or other semiconductor substrate materials.

Figure 5:
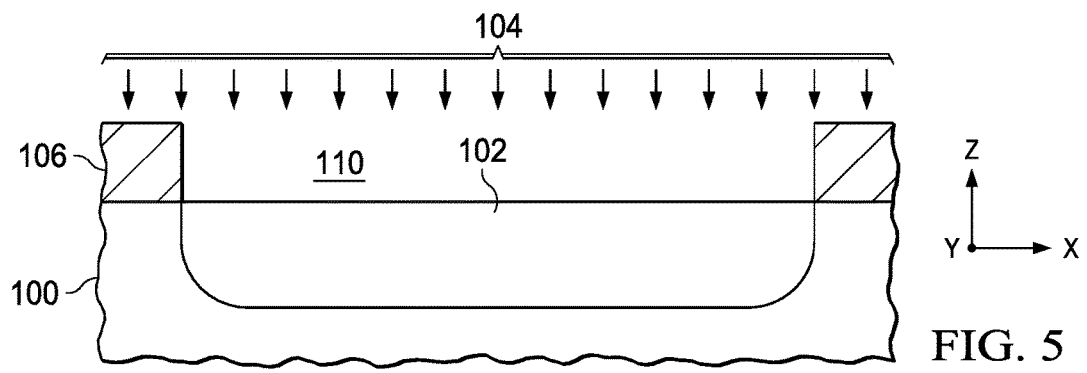
FIG. 5 is a cross-sectional view showing the formation of an n-well in the substrate of FIG. 4.

FIG. 5 illustrates the formation of an n-well 102 in the p-type substrate layer 100 by implanting an n-type dopant 104, such as phosphorus. Other types of n-type dopants may include arsenic or antimony. During the formation of the n-well 102 in the p-type substrate layer 100, a patterned photoresist layer 106 is formed over the substrate 100. The thickness of the patterned photoresist layer 106 may vary in correspondence with the wavelength of radiation used to pattern the photoresist. The photoresist layer 106 may be formed over the substrate 100 using any suitable technique, such as spin coating or spin casting deposition. Once deposited, the photoresist layer 106 may be etched, such as by wet etching or reactive ion etching (ME), to provide a patterned photoresist layer. In FIG. 5, a section of the photoresist layer 106 removed by etching results in an opening 110 in the photoresist layer 106 through which the substrate layer 100 is exposed. Thus, the patterned photoresist layer 106 serves as a mask to define the area of the n-well 102 during implant of the n-type dopant 104. The mask provided by the photoresist layer 106 may be sized such that it is greater than the area of a floating gate formed over the n-well 102 during subsequent processing.

In one example embodiment, the n-well 102 formed in the substrate layer 100 has a thickness of between approximately 1.5 µm and 2 µm. The orientation represented by the x, y, and z axes depicted in FIG. 5 may be assumed to be the same throughout each of FIGS. 3 to 15 illustrating the buried channel PMOS OTP memory 34 and fabrication thereof. Unless otherwise indicated, the thickness of a particular structure refers to its measurement in the z-direction, and the length of a particular structure refers to its measurement in the x-direction.

Figure 6:
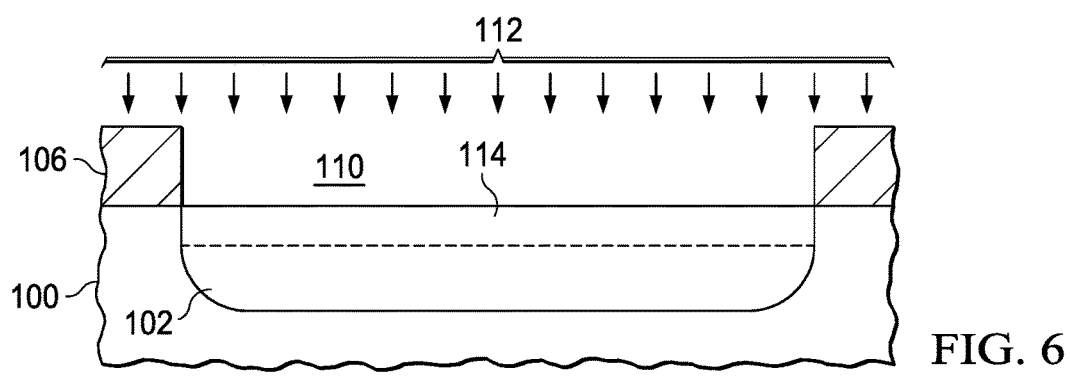
FIG. 6 is a cross-sectional view showing the formation of a buried channel region in the n-well of FIG. 5.

In FIG. 6, the patterned photoresist layer 106 is again used as a mask to define the area for a p-channel threshold voltage (Vtp) implant 112. The Vtp implant 112 forms region 114, which is a buried channel region 114 of the OTP memory 34. By way of example, the Vtp implant may include phosphorus and/or boron. The buried channel region 114 may have a thickness of between approximately 0.01 µm and 0.1 µm, for instance, approximately 0.05 µm in one embodiment. The buried channel region 114 may reduce the threshold voltage of the memory cell, which can result in a higher drive current but also increased off current leakage. As an example, when compared to a surface channel device, the addition of a buried channel region may decrease the threshold voltage from about 1.2V to between about 0.5 to 0.7V.

After the formation of the buried channel region 114, the substrate 100 is stripped of the photoresist layer 106 and cleaned before proceeding to the next fabrication step. The removal of the photoresist layer 106 may be performed using any suitable technique, such as by ultraviolet exposure, ozone ($O_3$), sulfuric acid ($H_2SO_4$), or plasma etching. The substrate may be cleaned after removal of the photoresist layer using, for example, an SPM (a sulfuric acid and hydrogen peroxide solution) clean process or an RCA (Radio Corporation of America) clean process.

Figure 7:
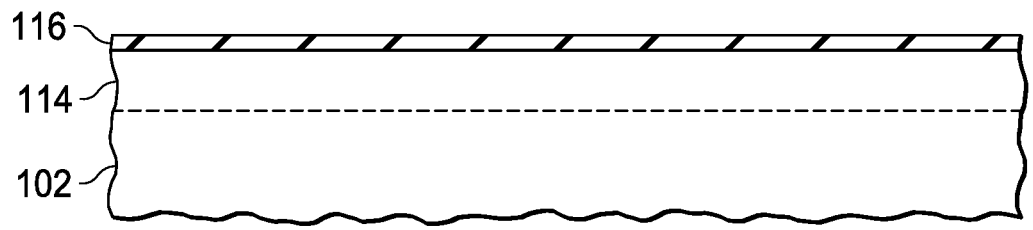
FIG. 7 is a cross-sectional view showing the formation of a gate dielectric layer over the structure of FIG. 6.

In FIG. 7, a gate dielectric layer 116 is formed over the n-well 102. The gate dielectric layer 116 may be formed using an oxidation process, such as wet and/or dry thermal oxidation processing. Other processes to form the gate dielectric layer 116 may also be used, such as a chemical vapor deposition (CVD) technique (including low pressure CVD (LPCVD), plasma enhanced CVD (PECVD), and rapid thermal CVD (RTCVD)) or physical vapor deposition (PVD). The gate dielectric layer 116 may have a thickness of between approximately 100 and 200 angstroms (Å) in one embodiment, for example, approximately 130 Å. Further, the gate dielectric layer 116 may be formed using any suitable oxide material, such as silicon dioxide ($SiO_2$), aluminum oxide ($Al_2O_3$), zirconium oxide ($ZrO_2$), or lanthanum oxide ($La_2O_3$), to name just a few. Those skilled in the art will appreciate that appropriate types of deposition techniques can be employed to grow suitable crystalline structures to form gate dielectric layers.

Figure 8:
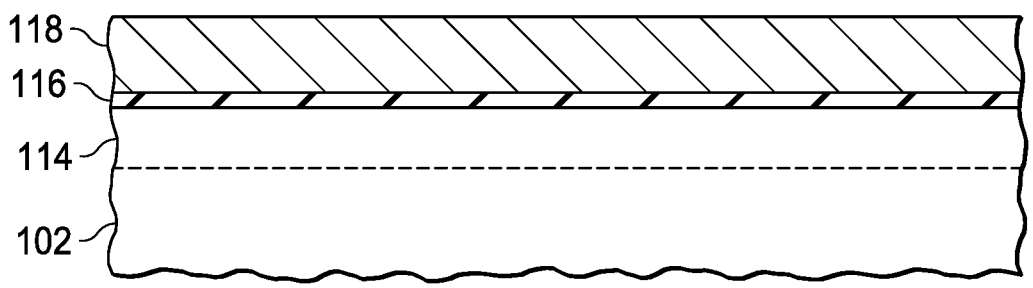
FIG. 8 is a cross-sectional view showing the formation of a conductive layer over the structure of FIG. 7.

A conductive layer 118 is then deposited over the gate dielectric layer 116, as shown in FIG. 8. The conductive layer 118 may be polysilicon and may be formed using any suitable technique, such as CVD, LPCVD, or PECVD. If polysilicon material is used to form the layer 118, the polysilicon may be formed in a polycrystalline state or an amorphous state that is later converted to a crystalline state. The polysilicon may also be formed using in-situ doping techniques and implantation techniques. In one embodiment, the conductive layer 118 may have a thickness of between approximately 3000 to 4000 Å, for example, approximately 3600 Å.

Figure 9:
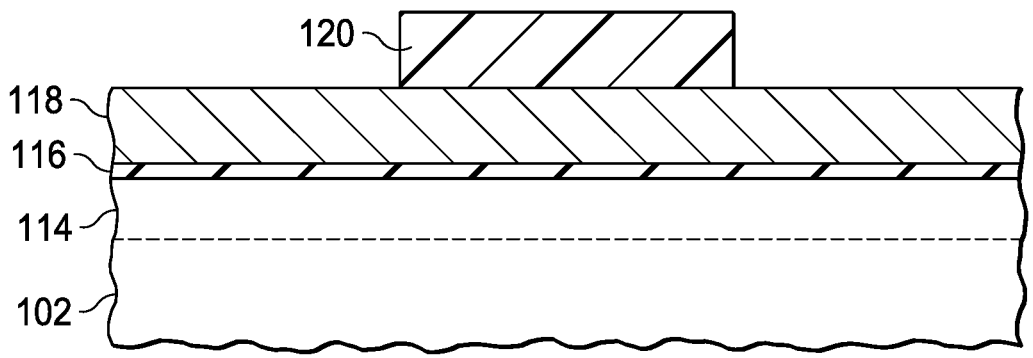
FIG. 9 is a cross-sectional view showing the addition of a mask over the conductive layer of FIG. 8.

FIG. 9 shows the formation of another patterned photoresist layer 120 over the conductive layer 118. Like the photoresist layer 106 in FIG. 5, the photoresist layer 120 may be formed using any suitable technique, such as spin coating or spin casting deposition, and may be patterned by an etching process, such as wet etching or RIE. The resulting patterned photoresist layer 120 is used as a mask to define the area of a floating gate during a subsequent etching process.

Figure 10:
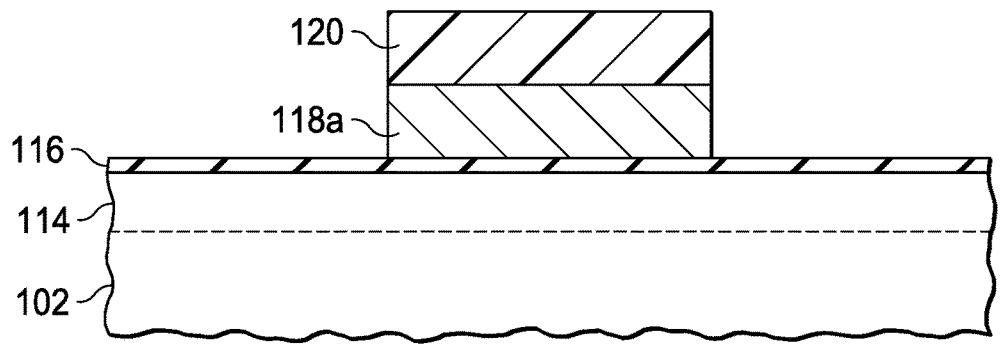
FIG. 10 is a cross-sectional view showing the structure of FIG. 9 undergoing an etching process to remove a portion of the conductive layer to form a floating gate.

FIG. 10 depicts the subsequent etching process in which portions of the conductive layer 118 not masked by the patterned photoresist layer 120 are removed. The remaining portion of the conductive layer 118 forms a floating gate 118a for the PMOS OTP memory 34. The resulting floating gate 118a has first and second ends in the x-direction defining a length of the floating gate 118a. In one embodiment, the floating gate 118a is formed with a length of between approximately 0.4 µm to 1 µm, for example, 0.7 µm. As will be appreciated, the etching performed in FIG. 10 may be carried out using any suitable wet or dry etching process, such as chemical wet etching, plasma etching, etc. After the etching and formation of the floating gate 118a, the photoresist layer 120 may be stripped off the floating gate and the structure cleaned. The stripping and cleaning steps may be performed using any suitable technique, such as ultraviolet exposure, sulfuric acid ($H_2SO_4$), or plasma etching for removal of the photoresist layer 120, followed by SPM or RCA cleaning.

Figure 11:
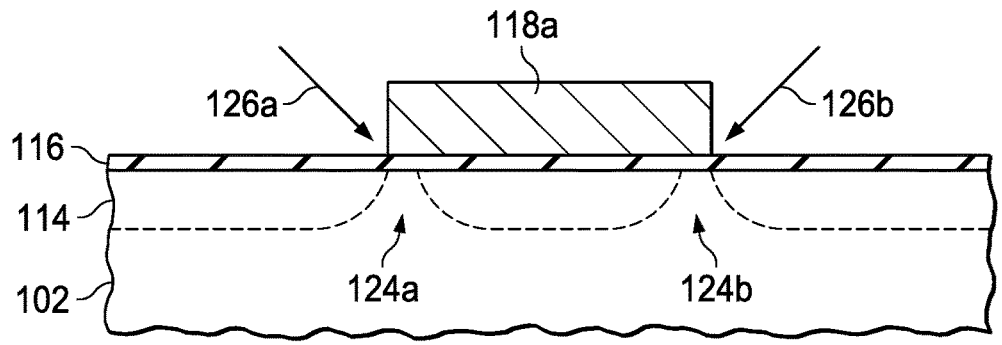
FIG. 11 is a cross-sectional view showing the formation of surface channel regions in the substrate under the floating gate.

In FIG. 11, surface channel regions 124a and 124b are formed in the n-well 102 at positions along the x-axis direction (an "x-position") generally corresponding to the x-positions at which the first end and second end of the overlying floating gate 118a are located. That is, the surface channel regions 124a and 124b may be formed in the n-well 102 under the first and second ends, respectively, of the floating gate 118a, so that surface channel region 124a has approximately the same x-position as but is located under the first end of the floating gate 118a, while surface channel region 124b has approximately the same x-position as but is located under the second end of the floating gate 118a. In the embodiment depicted by FIG. 11, after the formation of the surface channel regions 124a and 124b, a portion of the buried channel region 114 remains under the floating gate 118a and is interposed between the surface channel regions 124a and 124b. The channel region of the OTP memory 34 is understood to collectively include the buried channel region 114 and the surface channel regions 124a and 124b. Accordingly, the channel length of the OTP memory 34 can be determined as the sum of the length of the buried channel region 114 and the length of each of the surface channel regions 124a and 124b.

The surface channel regions 124a and 124b of FIG. 11 may be formed using n-type implants 126a and 126b, such as an n-type lightly doped drain (NLDD) implants, respectively, which may be phosphorus or arsenic, or any other suitable NLDD material. The NLDD implants 126a and 126b may be implemented in an angled manner as opposed to vertically (e.g., in the z-direction) as is case with the n-type dopant implant 104 forming the n-well 102 in FIG. 5. The angle of the NLDD implants 126a and 126b may be less than 90 degrees with respect to the surface of the substrate (e.g., the x-direction), for example, between approximately 30 degrees and 60 degrees. The NLDD implants 126a and 126b may be performed at the same angle or at different angles. In one embodiment, the angle of the NLDD implants 126a and 126b may be approximately 45 degrees.

The formation of the surface channel regions 124a and 124b increases the energy barrier along the channel of the PMOS OTP cell. This increases the threshold voltage of the device and the effective channel length, i.e., without increasing the physical channel length, allowing the transistor to exhibit properties of a device with a longer channel length, such as reduced I-off. For example, it has been observed that I-off of a buried channel memory cell constructed with surface channel regions 124a and 124b can be reduced by as much as six orders of magnitude, for example from μA to pA, thus significantly decreasing leakage. In one example embodiment, the illustrated buried channel PMOS OTP memory device may have an overall channel length of between approximately 0.4 and 0.7 μm, with each of the surface channel regions having a length of between approximately 0.05 to 0.1 μm, for example, approximately 0.08 μm.

It is further noted that the use of surface channel regions 124a and 124b allows for a reduction of the memory cell area. That is, because effective channel length is increased by forming the surface channel regions 124a and 124b, the physical channel length may be decreased while still maintaining the same or better performance characteristics, such as off state leakage and operating margin. By way of example only, it has been observed that a buried channel PMOS OTP memory with the above-described surface channel regions and having a channel length of approximately 0.4 μm may meet or even exceed the performance of a buried channel PMOS OTP memory cell without the above-described surface channel regions but having a channel length of approximately 0.7 μm or greater. This is a decrease of over 40% of the channel length, and can account for significant savings in memory cell area.

Figure 12:
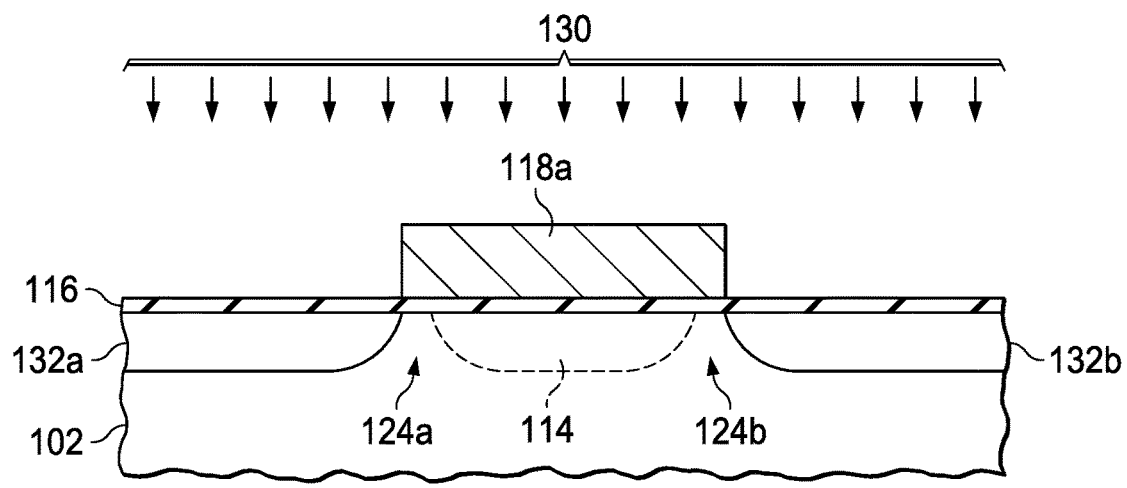
FIG. 12 is a cross-sectional view showing the formation of p-type lightly doped drain regions in the structure of FIG. 11.
Figure 13:
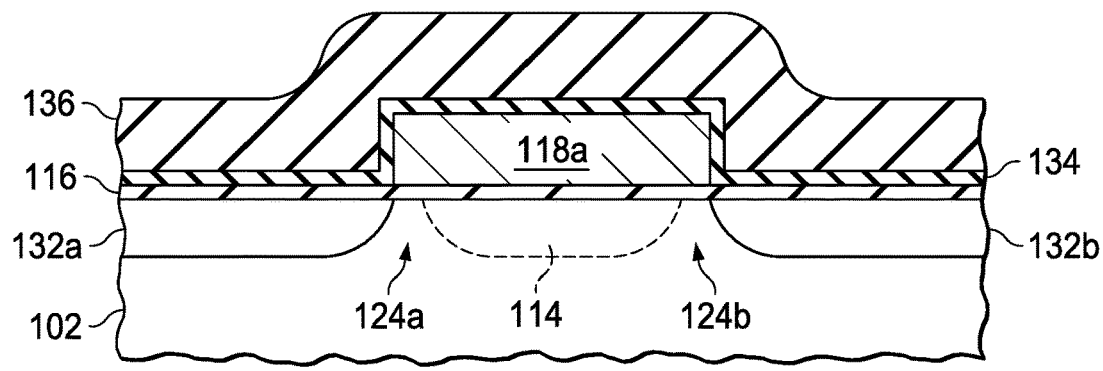
FIG. 13 is a cross-sectional view showing the formation of a nitride layer and an oxide layer over the structure of FIG. 12.

Referring to FIG. 12, following the formation of the surface channel regions 124a and 124b, p-type lightly doped drain (PLDD) regions 132a and 132b are formed by implant 130 of a p-type dopant material, such as boron difluoride ($BF_2$). In this implant step, the floating gate 118a acts as a mask. As shown in FIG. 13, after forming the PLDD regions 132a and 132b, an oxide layer 134 is formed over gate dielectric layer 116 and the floating gate 118a. A nitride layer 136 is then formed over the oxide layer 134. The formation of the oxide layer 134 may be performed using an oxidation process or by a CVD process, such as LPCVD. The nitride layer 136 may be formed by any suitable technique, such as CVD. In one embodiment, the oxide layer 134 may be $SiO_2$, and the nitride layer may be silicon nitride ($Si_3N_4$).

Figure 14:
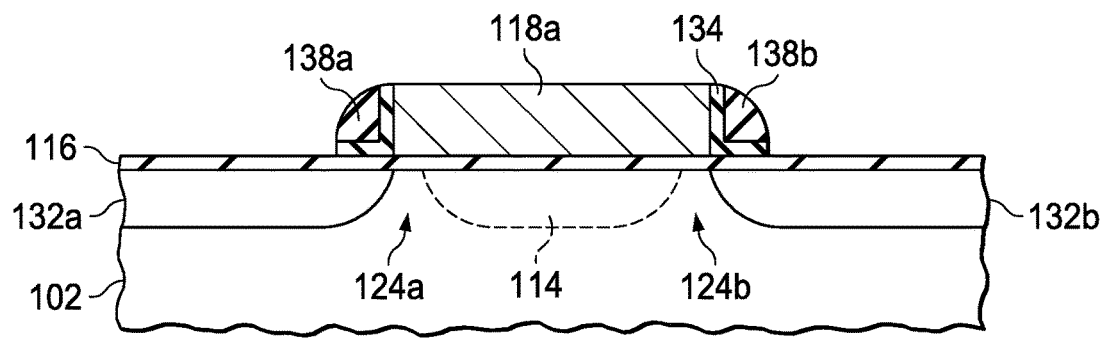
FIG. 14 is a cross-sectional view showing sidewall spacers adjacent to each end of floating gate that are formed by etching the nitride and oxide layers of FIG. 13.
Figure 15:
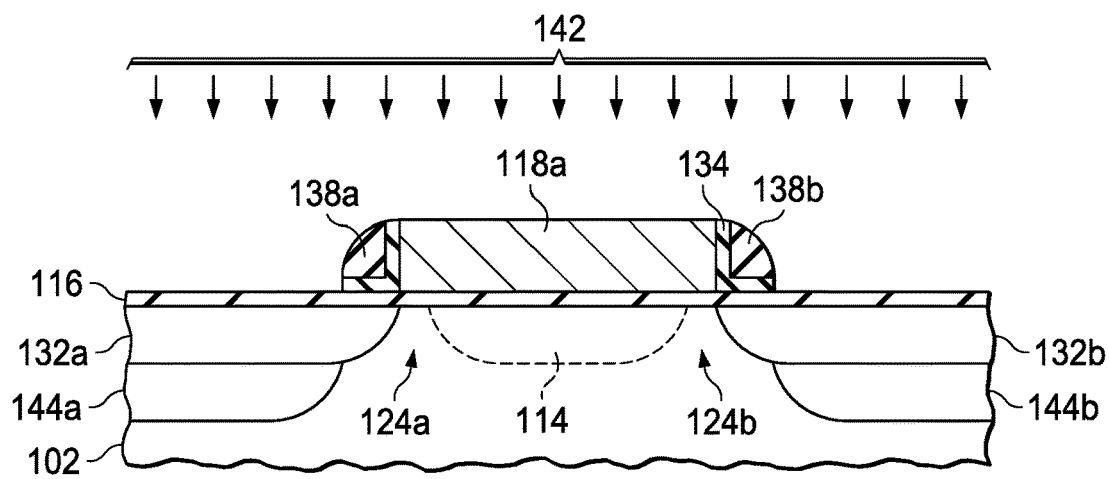
FIG. 15 is a cross-sectional view showing the formation of p-type source and drain regions in the structure of FIG. 14.

FIG. 14 shows the result of etching the structure of FIG. 13 to remove portions of the oxide layer 134 and nitride layer 136, resulting in sidewall spacers 138a and 138b. In one embodiment, the spacers 138a and 138b may each have a width (in the x-direction) of between approximately 0.2 to 0.3 μm, for example, approximately 0.22 μm. As shown next in FIG. 15, the spacers 138a and 138b serve as implantation masks to set a displacement length (in the x-direction) from the floating gate 118a for the implant 142 of p-type source drain (PSD) regions 144a and 144b. The implanted p-type dopant material that forms the PSD regions 144a and 144b may include boron and $BF_2$. The PLDD regions 132a and 132b and the PSD regions 144a and 144b collectively form the source and the drain of the depicted PMOS OTP memory 34. In one embodiment, the thickness of each of the source and drain may be between approximately 0.2 to 0.5 μm, for example, approximately 0.3 μm. Following the PSD implant 142, additional layers, such as one or more passivation layers (e.g., passivation layer 146) and/or metal layers (e.g., metal layer 148) may subsequently be formed over the buried channel PMOS OTP transistor structure, as is shown in FIG. 3. Contacts to the source and/or drain of the OTP memory 34 may also be formed, though for simplicity such contacts are not shown in FIG. 3.

Figure 16:
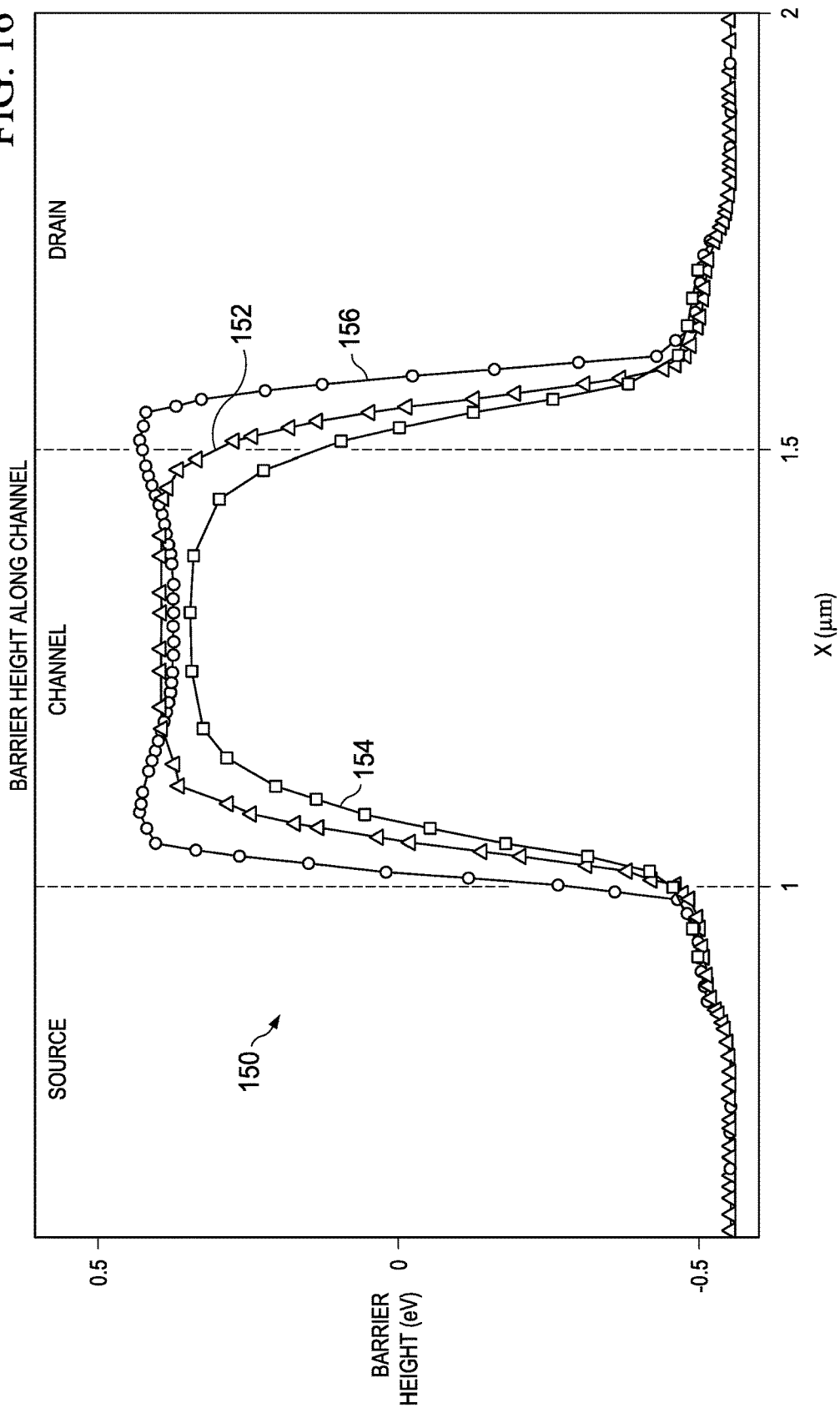
FIG. 16 is a graph comparing the energy barrier characteristics of a surface channel transistor, a buried channel transistor, and a buried channel transistor with implanted surface channel regions, such as that shown in FIG. 3.

As discussed above, the addition of the surface channel regions 124a and 124b using the angled NLDD implants (126a, 126b) shown in FIG. 11 increases the energy barrier along the channel of the device. FIG. 16 is a graph 150 comparing the energy barrier along the channel for a surface channel device, a buried channel device without NLDD surface channel regions, and a buried channel device with NLDD surface channel regions, as illustrated in FIGS. 3 to 15. In the graph 150, the y-axis represents barrier height (in electron-volts (eV)) and the x-axis represents position along the x-direction (referring to the axes shown in FIG. 5). Here, it can be seen that a buried channel device without the NLDD surface channel regions (curve 154) exhibits a lower energy barrier along the channel compared to a surface channel device (curve 152). However, when the NLDD implants forming the surface channel regions (124a, 124b of FIG. 11) are added to a buried channel device, the energy barrier is increased (curve 156) as compared to the buried channel device indicated by curve 154, particularly at locations closer to the ends of the floating gate where the surface channel regions are formed. In the example graph 150, the energy barrier indicated on curve 156 toward the ends of the floating gate is greater than even that of the surface channel device at the same locations, as indicated by curve 152.

FIG. 17 is another embodiment of a transistor that may be used to implement the OTP memory cell 30 of FIG. 2. The transistor in FIG. 17 is given reference number 34' to differentiate it from the transistor 34 described in FIGS. 3 to 15, but the same structures are identified using the same reference numbers. The transistor 34' is a PMOS OTP memory that includes surface channel regions 124a and 124b, but does not include a buried channel region 114. The transistor 34' may also include a passivation layer 146 and 150 like that shown in FIG. 3, though these are not explicitly shown in FIG. 17. The fabrication of transistor 34' may be similar to fabrication of the transistor 34 in FIGS. 4 to 15, but with the step of performing a Vtp implant 112 (FIG. 6) to form a buried channel region 114 being omitted.

Further, in accordance with disclosed embodiments, the forming of the surface channel regions 124a and 124b in the PMOS OTP memory 34 by the angled NLDD implant (e.g., 126a, 126b) may be performed as part of the same step of forming NLDD regions in an NMOS transistor on the same substrate 100. For example, FIG. 18 shows the PMOS OTP memory 34 and an NMOS transistor 160 being fabricated on the same substrate 100. The PMOS OTP memory 34 and the NMOS transistor 160 may be part of the same integrated circuit (e.g., the same die), or may be parts of different integrated circuits being fabricated on the substrate 100, which may be a wafer. One or more isolation structures 162, such as shallow trench isolation (STI) structures, may be formed between the PMOS OTP memory 34 and the NMOS transistor 160. The NMOS transistor 160, at this stage of the fabrication process, includes a gate oxide 168 and a gate 166. The PMOS OTP memory 34 is shown at the fabrication step corresponding to FIG. 6. An n-type implant 126, such as an NLDD implant, performed at this step may simultaneously form the surface channel regions 124a and 124b of the PMOS OTP memory 34 (via implants 126a and 126b) and NLDD regions 170a and 170b of the NMOS transistor 160 (via implants 126c and 126d).

Though the following figures show the formation of an OTP memory in an n-well 102 in a p-type substrate layer 100, in other embodiments, the substrate layer could be an n-type substrate. For instance, another embodiment of a device constructed in accordance with aspects of this disclosure could include an NMOS non-volatile memory cell with surface channel regions formed by PLDD implants. Moreover, memory devices in accordance with the present disclosure are not limited to OTP memories, and may include other types of non-volatile memory devices, such as EPROM or EEPROM.

While the specific embodiments described above have been shown by way of example, it will be appreciated that many modifications and other embodiments will come to the mind of one skilled in the art having the benefit of the teachings presented in the foregoing description and the associated drawings. Accordingly, it is understood that various modifications and embodiments are intended to be included within the scope of the appended claims.

What is claimed is:

1. A method for fabricating a non-volatile memory comprising:
    forming a buried channel region in a substrate;
    forming a gate dielectric layer over the substrate;
    forming a floating gate over the gate dielectric layer;
    forming a first surface channel region under a first end of the floating gate;
    forming a second surface channel region under a second end of the floating gate opposite the first end; and
    forming a source and a drain in the substrate.

2. The method as claimed in claim 1, wherein after forming the first and second surface channel regions, the buried channel region is interposed between the first and second surface channel regions under the floating gate.

3. The method as claimed in claim 1, wherein the first surface channel region and the second surface channel region are formed by performing a lightly doped drain (LDD) implant.

4. The method as claimed in claim 3, wherein the LDD implant that forms the first surface channel region and the second surface channel region is performed at an angle of less than 90 degrees with respect to the surface of the substrate on which the gate dielectric layer is formed.

5. The method as claimed in claim 4, wherein the angle is approximately 45 degrees.

6. The method as claimed in claim 1, wherein the non-volatile memory comprises a PMOS floating gate transistor, the substrate is a p-type substrate, and forming the buried channel region in the p-type substrate comprises:
    forming an n-well in the p-type substrate by performing an n-type dopant implant; and
    forming the buried channel region in the n-well by performing a p-channel threshold voltage (Vtp) implant.

7. The method as claimed in claim 6, wherein the Vtp implant comprises at least one of boron and phosphorus.

8. The method as claimed in claim 6, wherein the LDD implant that forms the first surface channel region and the second surface channel region is an n-type light doped drain (NLDD) implant.

9. The method as claimed in claim 8, wherein the NLDD implant forming the first surface channel region and the second surface channel region is performed at an angle of less than 90 degrees with respect to the surface of the p-type substrate on which the gate dielectric layer is formed.

10. The method as claimed in claim 9, wherein the NLDD implant is performed at a first angle to form the first surface channel region and at a second angle to form the second surface channel region, wherein the first and second angles are each between approximately 30 and 60 degrees with respect to the surface of the p-type substrate on which the gate dielectric layer is formed.

11. The method as claimed in claim 10, wherein the first and second angles are different.

12. The method as claimed in claim 8, wherein the NLDD implant comprises phosphorus.

13. The method as claimed in claim 6, wherein forming the source and the drain in the p-type substrate comprises:
    forming first and second p-type lightly doped drain (PLDD) regions in the n-well by performing a PLDD implant, the first PLDD region being formed on a first side of the floating gate and the second PLDD region being formed on a second side of the floating gate;
    forming first and second sidewall spacers over the gate dielectric layer, the first sidewall spacer being adjacent to the first end of the floating gate and the second sidewall spacer being adjacent to the second end of the floating gate; and
    forming first and second p-type source drain (PSD) regions in the n-well by performing a PSD implant using the sidewall spacers as a mask, the first PSD region being formed on the first side of the floating gate and the second PSD region being formed on the second side of the floating gate, wherein the first PLDD region and first PSD region form the source and the second PLDD region and the second PSD region form the drain.

14. A device comprising:
    a non-volatile memory having a plurality of non-volatile memory cells, each non-volatile memory cell including a floating gate transistor comprising:
        a substrate including a channel region formed between a source and a drain, wherein the channel region includes a buried channel region, a first surface channel region, and a second surface channel region, and wherein the buried channel portion is interposed between the first surface channel region and the second surface channel region; and
        a floating gate disposed over the substrate and overlying the channel region.

15. The device as claimed in claim 14, wherein the first surface channel region is located under a first end of the floating gate, the second surface channel region is located under a second end of the floating gate opposite the first end, and the buried channel region is located under a portion of the floating gate between the first and second ends.

16. The device as claimed in claim 14, wherein:
    the floating gate transistor is a PMOS floating gate transistor;
    the substrate is a p-type substrate including an n-well region in which the channel region is formed;
    the buried channel region includes a Vtp implant; and the first and second surface channel regions include n-type lightly doped drain (NLDD) implants.

17. The device as claimed in claim 16, wherein the non-volatile memory cell is a PMOS one time programmable (OTP) memory cell.

18. A memory transistor comprising:
a substrate including a source, a drain, and a channel region extending between the source and the drain, wherein the channel region includes first and second surface channel regions at respective first and second ends of the channel region, the first surface channel region including a first lightly doped drain (LDD) implant region, and the second surface channel region including a second LDD implant region; and
a floating gate arranged over the substrate and overlying the channel region, wherein the LDD region is located under one of first and second opposite ends of the floating gate,
wherein the channel region includes a buried channel region located under the floating gate, the buried channel region being interposed between the first and second surface channel regions.

19. The memory transistor as claimed in claim 18, wherein the second LDD region is located under the other of the first and second opposite ends of the floating gate.

20. The memory transistor as claimed in claim 18, wherein the substrate is a p-type substrate, the LDD implant is an n-type LDD implant, and the buried channel region comprises a p-channel threshold voltage (Vtp) implant.

* * * * *